United States Patent
Parekh et al.

(10) Patent No.: US 12,525,509 B2
(45) Date of Patent: Jan. 13, 2026

(54) NANO THROUGH SUBSTRATE VIAS FOR SEMICONDUCTOR DEVICES AND RELATED SYSTEMS AND METHODS

(71) Applicant: Micron Technology, Inc., Boise, ID (US)

(72) Inventors: Kunal R. Parekh, Boise, ID (US); Angela S. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 571 days.

(21) Appl. No.: 17/827,006

(22) Filed: May 27, 2022

(65) Prior Publication Data

US 2023/0386970 A1    Nov. 30, 2023

(51) Int. Cl.
   *H01L 23/48*      (2006.01)
   *H01L 21/768*     (2006.01)
   *H10D 1/68*       (2025.01)

(52) U.S. Cl.
   CPC ...... *H01L 23/481* (2013.01); *H01L 21/76898* (2013.01); *H10D 1/68* (2025.01)

(58) Field of Classification Search
   CPC ... H01L 80/00; H01L 28/40; H01L 21/76898; H01L 21/76877; H01L 23/481; H01L 23/485
   See application file for complete search history.

(56) References Cited

U.S. PATENT DOCUMENTS

| | | | |
|---|---|---|---|
| 2019/0013259 A1* | 1/2019 | Hu | H01L 21/7685 |
| 2020/0083591 A1* | 3/2020 | Hsieh | H01Q 21/30 |
| 2020/0350223 A1* | 11/2020 | Shih | H01L 23/3121 |
| 2021/0375737 A1* | 12/2021 | Lin | H01L 23/13 |

* cited by examiner

Primary Examiner — Marlon T Fletcher
Assistant Examiner — Christina A Sylvia
(74) Attorney, Agent, or Firm — Dorsey & Whitney LLP (57) ABSTRACT

Semiconductor devices having nano through substrate vias (TSVs), and related systems and methods, are disclosed herein. In some embodiments, the semiconductor device includes a semiconductor substrate that has a first surface and a second surface opposite the first surface. A trench is formed in the first surface and filled with a dielectric material and a TSV extends from the first surface to the second surface within the footprint of the trench. In some embodiments, the TSV includes a conductive material that includes a first portion and a second portion. The first portion includes a first end at the first surface and a second end with a larger cross-sectional area than the first end. Similarly, the second portion includes a third end coupled to the second end and a fourth end at the second surface with a larger cross-sectional area than the third end.

13 Claims, 10 Drawing Sheets

NANO THROUGH SUBSTRATE VIAS FOR SEMICONDUCTOR DEVICES AND RELATED SYSTEMS AND METHODS

TECHNICAL FIELD

The present technology is generally related to methods for through substrate vias in semiconductor devices and related systems and products. In particular, the present technology relates to the construction of self-aligned nano through substrate vias.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. To meet continual demands on decreasing size, individual semiconductor dies and/or components are typically manufactured in bulk and then stacked to form semiconductor assemblies. Components of the semiconductor assemblies are often electrically coupled at least partially using through substrate vias extending from one surface of a substrate to another. However, the through substrates vias are becoming a limiting factor as semiconductor assemblies continue to shrink in size.

The drawings have not necessarily been drawn to scale. Further, it will be understood that several of the drawings have been drawn partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Semiconductor devices having one or more nano through substrate vias (referred to herein as "TSVs"), and related systems and methods, are disclosed herein. The systems and methods disclosed allow semiconductor assemblies to continue to shrink in size and/or increase in productivity within a given footprint. In some embodiments, a method for forming the TSV(s) includes removing material from a first surface (e.g., an upper surface) of a semiconductor substrate to form a trench that isolates one or more pillars of the semiconductor substrate within the trench, then filling the trench with a dielectric material. Once formed, each of the pillar(s) can have sidewalls that slope inwardly from a base surface of the trench to the first surface of the semiconductor substrate. Said another way, each of the pillar(s) can have a smaller cross-sectional area at the first surface of the semiconductor substrate than at a base of the pillar (e.g., at the base surface of the trench). In contrast, the trench can include peripheral sidewalls that slope outwardly from the base surface of the trench to the first surface of the semiconductor substrate. Said another way, the trench can have a larger cross-sectional area at the first surface of the semiconductor substrate than at the base of the trench. As a result, the sidewalls of the trench slope generally opposite the sidewalls of the pillar(s). In some embodiments, the magnitude of the slope of the peripheral sidewalls of the trench is generally equal to (or equal to) the magnitude of the slope of the sidewalls of the pillar(s). The slopes of sidewalls for the pillar(s) and/or trenches can help facilitate easier alignment during the formation of pillar(s) and/or trenches from opposite surfaces when forming vias across the substrate. For example, as discussed in more detail below, the slope of the sidewalls of the pillar(s) ensures that the base of each of the pillar(s) presents a larger target from the opposite side ad allows the entirety of the pillar(s) to be more easily etched when any portion of the base is exposed.

In some embodiments, after filling the trench with the dielectric material, the method also includes forming a second trench (sometimes also referred to herein as an "aperture") in a second surface of the semiconductor substrate opposite the first surface. The aperture can be at least partially vertically aligned with at least one of the pillar(s) and have a deepest surface at a depth corresponding to the base of the pillar(s). As a result, the second trench exposes the pillar(s) through the second surface of the semiconductor substrate. The method can then include etching one or more of the pillar(s) through the aperture to form a void (sometimes also referred to herein as an opening) extending from the first surface to the second surface and filling the void with a conductive material forming a conductive TSV.

In some embodiments, the method includes filling the second trench with a second dielectric material before etching the pillar(s), then re-exposing the pillar(s) through the second dielectric material. In such embodiments, etching the pillar(s) can include a wet etching process because the second dielectric material can prevent the wet etching process from removing unintended material from the semiconductor substrate. The second dielectric can help insulate and/or otherwise protect non-targeted portions of the semiconductor substrate (e.g., the bases of non-targeted pillars, the sidewalls of the second trench, and the like); helps decrease parasitic capacitance after the vias are fully formed; and/or allows pillars to be selectively etched and filled (e.g., forming vias one at a time or in groups, forming conductive vias in place of some pillars and capacitors in place of others, and the like). In some embodiments, the method includes depositing a layer of an insulation material onto the sidewalls of the aperture before etching the pillar(s). Similar to the second dielectric material, the layer of insulation material can protect any further etching of the sidewalls, thereby focusing the etching process on the pillar(s).

In some embodiments, the method includes removing material from the second surface of the semiconductor substrate rather than (or in addition to) forming the second trench through a substrate-thinning process. In some such embodiments, the substrate-thinning process exposes the base of each of the pillar(s) at the thinned second surface of the semiconductor substrate. As a result, one or more of the pillar(s) can be removed by depositing and patterning a photoresist material on the thinned second surface and etching the pillar(s) through the pattern.

Any of the formation methods discussed above can enable each of the TSVs to be aligned to one or more conductive structures on the first surface of the semiconductor substrate (e.g., a metallization layer, and components thereof, carried by the upper surface of the semiconductor substrate). For example, as discussed above, the dielectric material in the second trench and/or the layer of insulation material can protect the semiconductor substrate from further etching. Accordingly, the second trench need only expose a portion of the base of the pillar(s) to allow the pillar(s) to be fully exhumed and replaced with the conductive material without further etching the semiconductor substrate. As a result, the method can allow the TSVs to be easily placed in the spaces formally occupied by the pillars without needing to first thin the semiconductor substrate. Accordingly, the formation does not risk various defects and failures (e.g., die cracks) typically associated with thinning the semiconductor substrate to form the TSVs. In some embodiments, the pillars are surrounded by a dielectric material. In such embodiments, the method can allow the TSVs to be precisely placed with reduced risk of cracking the semiconductor substrate, even when the semiconductor substrate is thinned before etching the pillars. For example, the isolation of each of the pillars by the dielectric material can protect the semiconductor substrate from any unintentional etching.

In some embodiments, a semiconductor device resulting from the methods discussed above includes a semiconductor substrate that has a first surface and a second surface opposite the first surface. A trench is formed in the first surface and filled with a dielectric material, and a TSV extends from the first surface to the second surface within the cross-sectional area of the trench. The TSV has a conductive material that includes a first portion and a second portion continuous with the first portion.

The first portion is surrounded by the dielectric material and includes a first end at the first surface of the semiconductor substrate and a second end opposite the first end (e.g., at a base of the trench). The first end has a first cross-sectional area and the second end has a second cross-sectional area larger than the first cross-sectional area. Similarly, the second portion includes a third end coupled to the second end of the first portion and a fourth end at the second surface of the semiconductor substrate. The third end has a third cross-sectional area that is different from the second cross-sectional area, and the fourth end has a fourth cross-sectional area larger than the third cross-sectional area.

Said another way, each of the first and second portions has a generally frustoconical shape, with sidewalls that slope inwardly toward the smaller first and third ends. In contrast, for example, the trench (and the dielectric therein) include peripheral sidewalls that slope outwardly from a first end at a base of the trench to a second end at the first surface of the semiconductor substrate (e.g., generally opposite the slope of the sidewalls of the TSV). In some embodiments, the magnitude of the slope of the peripheral sidewalls of the trench is generally equal to (or equal to) the magnitude of the slope of the sidewalls of the first and/or second portions.

For ease of reference, the three-dimensional trace length matching features are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the three-dimensional trace length matching features, and the associated semiconductor components and devices, can be moved to, and used in, different spatial orientations without changing the structure and/or function of the disclosed embodiments of the present technology.

Further, although primarily discussed herein as a process for forming nano TSVs for use in a silicon-based semiconductor substrate, one of skill in the art will understand that the scope of the invention is not so limited. For example, the method for forming nano TSVs can also be deployed to create nano TSVs in any other suitable semiconductor substrate (e.g., prepreg, PCB, and the like). Accordingly, the scope of the invention is not confined to any subset of embodiments, and is confined only by the limitations set out in the appended claims.

FIGS. 1A-1M illustrate top and cross-sectional views of a semiconductor device 100 after various stages of a process for producing nano through substrate vias (TSVs) in accordance with some embodiments of the present technology.

Figure 1A:
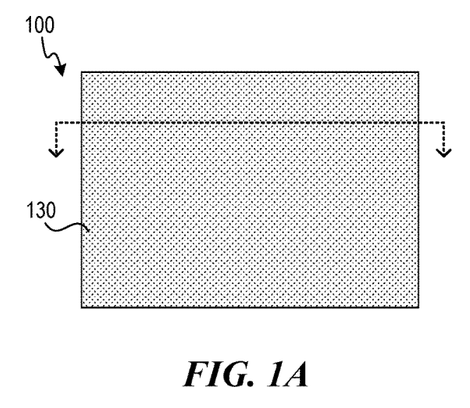
FIGS. 1A-1M illustrate top and cross-sectional views of a semiconductor device after various stages associated with producing nano through substrate vias in accordance with some embodiments of the present technology.
Figure 1B:
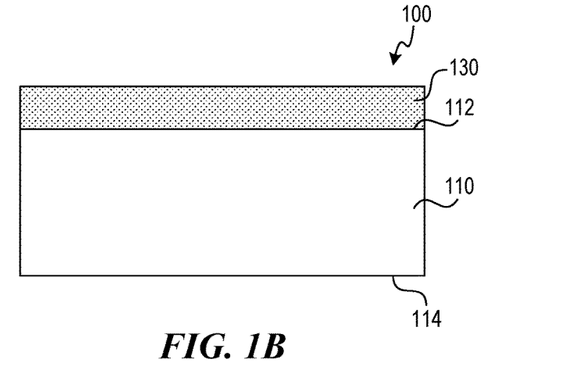

FIGS. 1A and 1B are top and cross-sectional views, respectively, of the semiconductor device 100 at the start of the process. As illustrated, the semiconductor device 100 includes a semiconductor substrate 110 that has a first surface 112 (e.g., an upper surface) and a second surface 114 (e.g., a lower surface) opposite the first surface 112. As further illustrated in FIGS. 1A and 1B, the process begins by depositing a photoresist layer 130 onto the first surface 112 of the semiconductor substrate 110 (sometimes also referred to herein as a "base substrate").

Figure 1C:
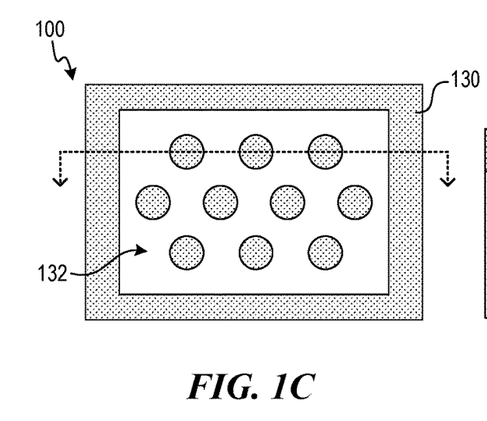
Figure 1D:
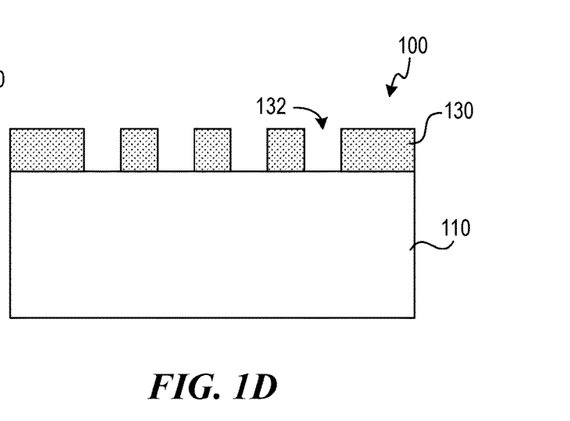

FIGS. 1C and 1D are top and cross-sectional views, respectively, of the semiconductor device 100 after a pattern 132 has been formed in the photoresist layer 130. The pattern 132 exposes a first portion of the first surface 112 while protecting a second portion. As best illustrated in FIG. 1C, the second portion includes a peripheral portion of the first surface 112 as well as one or more (ten shown) islands on the first surface 112. In the illustrated embodiment, the islands are arranged in a relatively well-spaced array. In various other embodiments, the islands can be arranged in any other pattern according to a planned signal distribution in the semiconductor device 100.

Figure 1E:
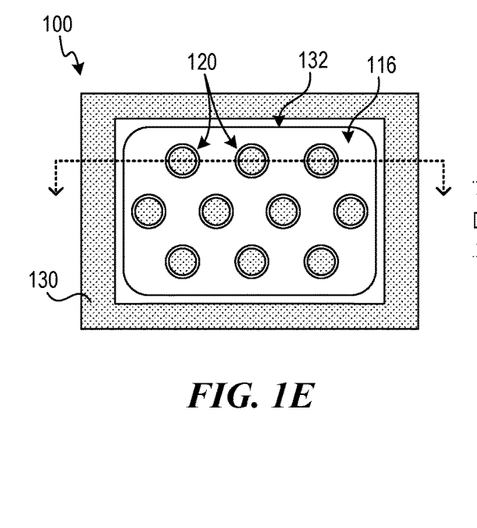
Figure 1F:
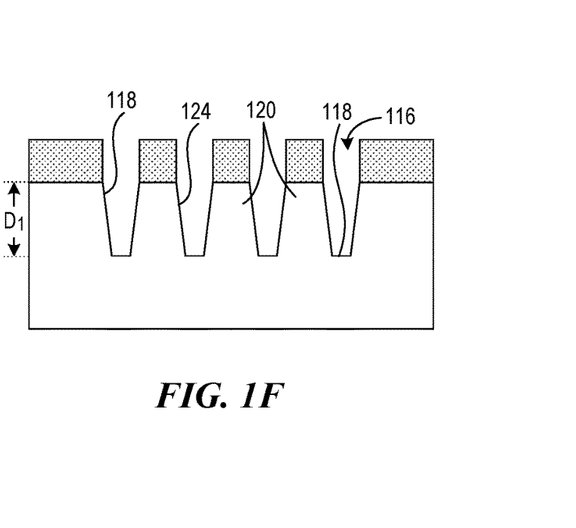

FIGS. 1E and 1F are top and cross-sectional views, respectively, of the semiconductor device 100 after etching the first surface 112 of the semiconductor substrate 110 through the photoresist layer 130. In one embodiment, the etching process is generally similar, if not identical, to the process of forming shallow trench isolation. As illustrated, the etching process forms a first trench 116 in the first surface 112 in a shape generally corresponding to the pattern 132. As best illustrated in FIG. 1F, the first trench 116 has a base surface 118 at a depth $D_1$ into the semiconductor substrate 110 and peripheral sidewalls 119 that slope outwardly from the base surface 118 of the first trench 116 to the first surface 112 of the semiconductor substrate 110. Although illustrated as approximately halfway through the semiconductor substrate 110, the depth $D_1$ can be varied by executing the etching process for longer times and/or shorter times.

As further illustrated in FIGS. 1E and 1F, the etching process also results in one or more pillars 120 of the semiconductor substrate 110 (ten shown, corresponding to the ten islands) within the cross-sectional area of the first trench 116. Each of the pillars 120 also includes sidewalls 124 sloping inwardly from the base surface 118 of the first trench 116 to the first surface 112 of the semiconductor substrate 110. That is, the sidewalls 124 of the pillars 120 slope generally opposite to the peripheral sidewalls 119 of the first trench 116.). In some embodiments, the magnitude of the slope of the sidewalls 124 of the pillars 120 is generally equal to (or equal to) the magnitude of the slope of the peripheral sidewalls 119 of the first trench 116.

Figure 1G:
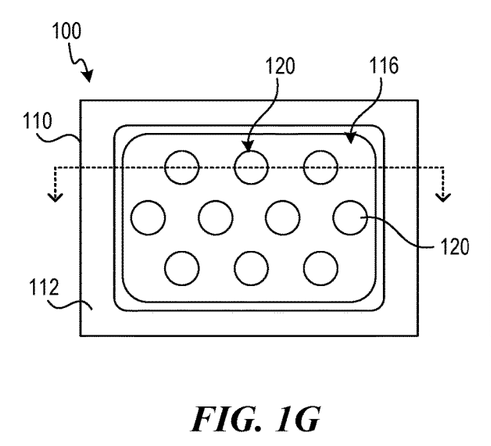
Figure 1H:
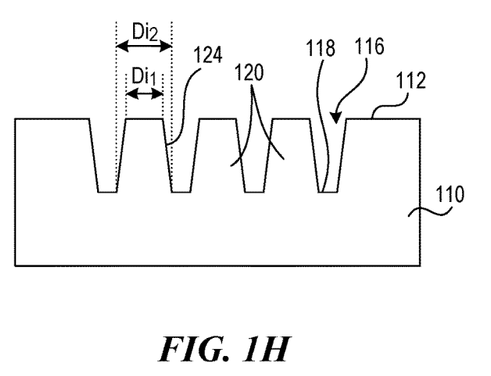
Figure 1I:
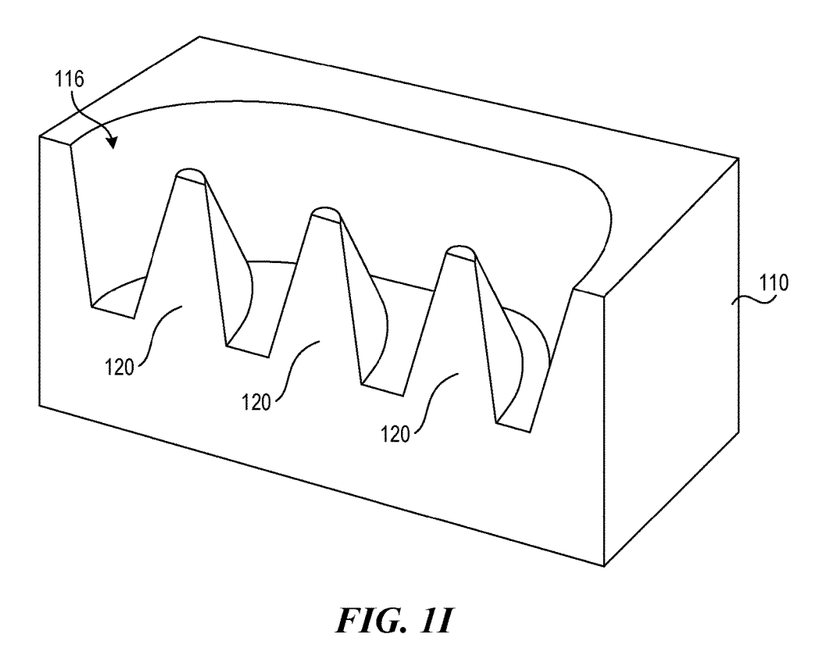

FIGS. 1G-1I are top, cross-sectional, and isometric cross-sectional views, respectively, of the semiconductor device 100 after stripping the photoresist layer 130 (FIGS. 1E and 1F) from the first surface 112 of the semiconductor substrate 110. FIGS. 1G-1I also illustrate additional details about the pillars 120. In particular, as best illustrated in FIG. 1H, each of the pillars 120 has a first diameter $Di_1$ at an upper surface of the pillar 120 (e.g., at an elevation adjacent the first surface 112 of the semiconductor substrate 110) and a second diameter $Di_2$ at a base of the pillar 120 (e.g., at an elevation adjacent the base surface 118 of the first trench 116). Because the sidewalls 124 of the pillars 120 slope inwardly from the base to the upper surface of each of the pillars 120, the first diameter $Di_1$ is smaller than the second diameter $Di_2$. Said another way, each of the pillars 120 has a larger cross-sectional area at a base of the pillar 120 than at an upper surface of the pillar 120. Said in yet another way, each of the pillars 120 has a generally frustoconical shape. Furthermore, as best illustrated in FIG. 1I, each of the pillars 120 is surrounded by the empty space created by the first trench 116.

Figure 1J:
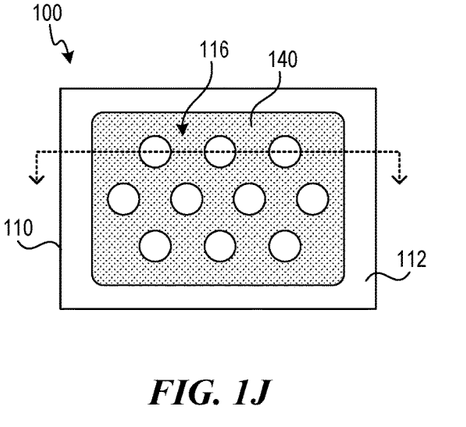
Figure 1K:
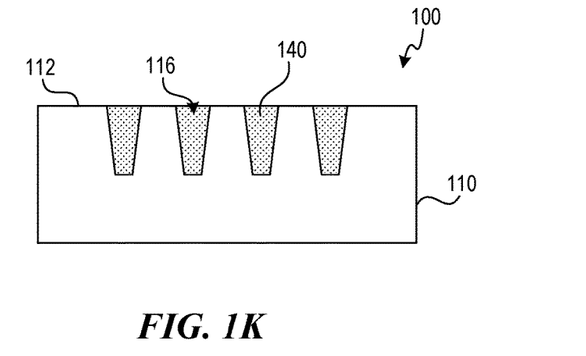

FIGS. 1J and 1K are top and cross-sectional views, respectively, of the semiconductor device 100 after filling the first trench 116 with a dielectric material 140. In some embodiments, the dielectric material 140 is slowly filled and/or filled using an injection process to avoid overfilling the first trench 116. In some embodiments, the dielectric material 140 is intentionally overfilled and the semiconductor device 100 is polished to remove excess dielectric material 140 and re-expose the first surface 112 of the semiconductor substrate 110. In the illustrated embodiment, the dielectric material 140 surrounds each of the pillars 120, thereby electrically insulating the pillars 120 from each other.

Figure 1L:
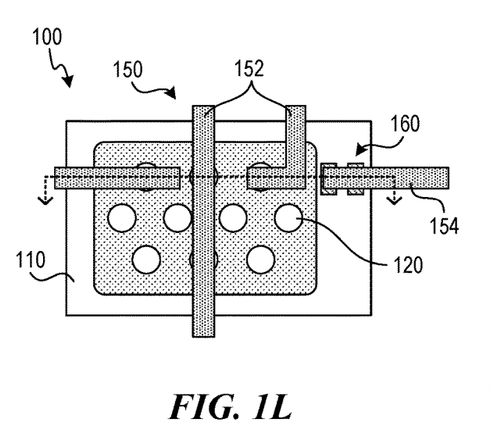
Figure 1M:
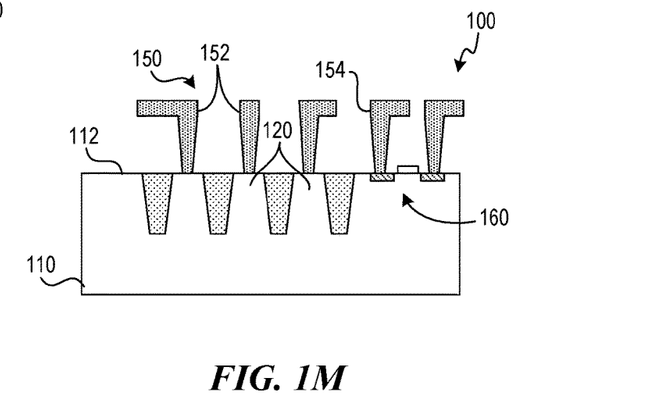

FIGS. 1L and 1M are top and cross-sectional views, respectively, of the semiconductor device 100 after forming a metallization layer 150 over the first surface 112 of the semiconductor substrate 110 as well as one or more active components 160 (one shown). In the illustrated embodiment, the metallization layer 150 includes one or more first routing structures 152 (three shown) in contact with the first surface 112 in a position vertically aligned with at least one of the pillars 120. Additionally, the metallization layer 150 includes one or more second routing structures 154 (one shown) that are electrically coupled to the active component(s) 160 at the first surface 112.

The active component(s) 160 can include transistors, capacitors, one or more integrated circuits, and/or any other suitable components for the semiconductor device. In the illustrated embodiment, for example, the active component 160 includes a complementary metal-oxide-semiconductor (CMOS) transistor that includes wells formed into the first surface 112 of the semiconductor substrate 110.

Figure 2A:
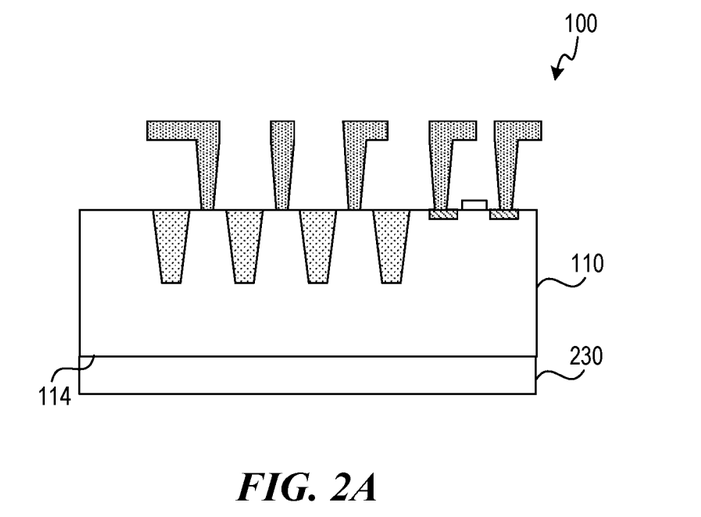
FIGS. 2A-2D are partially schematic cross-sectional views of a semiconductor device after various stages associated with producing nano through substrate vias in accordance with some embodiments of the present technology.

FIGS. 2A-2D are partially schematic cross-sectional views of a semiconductor device 100 of the type resulting from the process in FIGS. 1A-1M during and/or after various stages of producing TSVs in accordance with some embodiments of the present technology. For example, FIG. 2A illustrates the semiconductor device 100 after a second photoresist material 230 is deposited onto the second surface 114 of the semiconductor substrate 110.

Figure 2B:
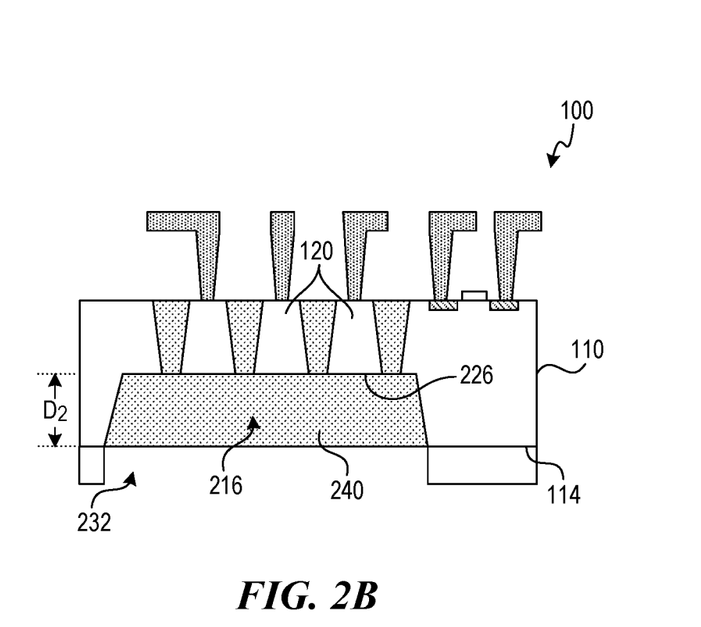

FIG. 2B illustrates the semiconductor device 100 after patterning the second photoresist material 230 to form a pattern 232 that is vertically aligned with at least one of the pillars 120. In the illustrated embodiment, each of the pillars 120 is vertically aligned with the pattern 232. The second surface 114 of the semiconductor substrate 110 can then be etched to form a second trench 216 in the second surface 114. As further illustrated in FIG. 2B, the second trench 216 is formed to a second depth $D_2$ such that the second trench 216 exposes a base surface 226 of at least one of the pillars 120. The second trench 216 can then be filled with a second dielectric material 240. As a result, each of the pillars 120 is fully isolated from any of the other pillars 120 and/or the remainder of the semiconductor substrate 110 (e.g., is not contiguous with any other portion of semiconductor substrate). The isolation can allow one or more of the pillars 120 to then be selectively etched and/or exhumed and replaced with a conductive TSV.

Figure 2C:
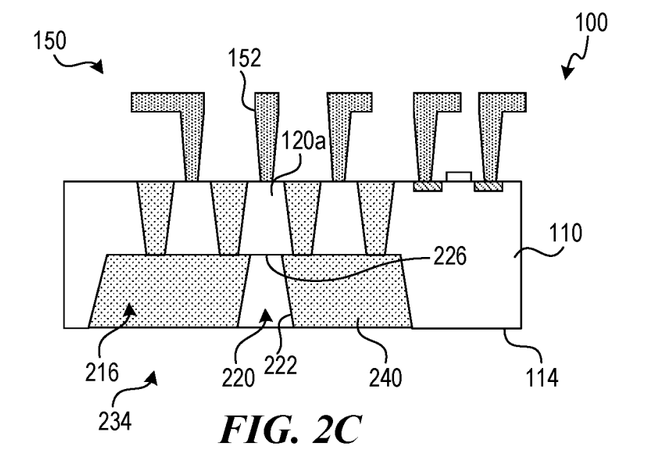

For example, FIG. 2C illustrates the semiconductor device 100 after removing the second photoresist material and selectively etching the second dielectric material 240 to form an opening 220 that exposes a central pillar 120a. The opening 220 can be formed by depositing a third photoresist material, patterning the third photoresist material, etching the second dielectric material 240 through the pattern in the third photoresist material, then stripping the third photoresist material. As illustrated in FIG. 2C, the opening 220 has sidewalls 222 that slope inwardly from the second surface 114 of the semiconductor substrate 110 to the base surface 226 of the central pillar 120a.

By forming the opening 220 in the second dielectric material 240, the process creates an access point to the central pillar 120a. Because both the access point and the central pillar 120a itself are surrounded by a dielectric material, the process can then include an anisotropic etching process (sometimes referred to as a wet etching process) to fully remove the central pillar 120a without using any masking and/or insulation layer to protect the dielectric materials. The process of exposing and etching the central pillar 120a that is illustrated in FIGS. 2A-2C is sometimes referred to herein as a process of exhuming the central pillar 120a. Once the central pillar 120a is fully exhumed, the opening 220 can extend from the second surface 114 of the semiconductor substrate 110 to the first routing structures 152 at the first surface 112 of the semiconductor substrate 110.

Figure 2D:
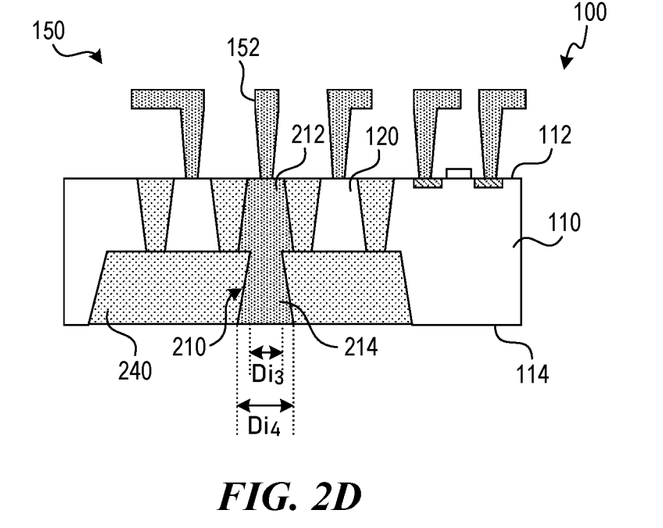

FIG. 2D illustrates the semiconductor device 100 after the void between the first and second surfaces 112, 114 of the semiconductor substrate 110 is filled with a conductive material 210, thereby forming a TSV between the first and second surfaces 112, 114. The conductive material 210 can include a first portion 212 and a second portion 214. The first portion 212 includes a first end at the first surface 112 and a second end opposite the first end such that the first portion 212 fills the space previously occupied by the central pillar 120a (FIG. 2C). Similarly, the second portion 214 includes a first end coupled to the second end of the first portion 212 and a second end opposite the first end and at the second surface 114 such that the second portion 214 fills the opening 220 (FIG. 2C). As further illustrated in FIG. 2D, the first portion 212 has a frustoconical shape, with the first end having a first diameter $Di_3$ (and therefore a first cross-sectional area) while the second end has a second diameter $Di_4$ (and therefore a second cross-sectional area) that is greater than the first diameter $Di_3$. Similarly, the second portion 214 also has a frustoconical shape, with the first end having a first diameter $Di_3$ (and therefore a first cross-sectional area) while the second end has a second diameter $Di_4$ (and therefore a second cross-sectional area) that is greater than the first diameter $Di_3$.

That is, in the illustrated embodiment, the first portion 212 has generally the same shape and dimensions as the second portion 214 (e.g., resulting from the first and second portions 212, 214 each extending halfway through the semiconductor substrate 110. However, in other embodiments, the first and second portions 212, 214 can each have a generally frustoconical shape with varying dimensions. Purely by way of example, the second portion 214 can include the first end 215a having a third diameter different from either of the first and second diameters $Di_3$, $Di_4$, while the second end 215b has a fourth diameter that is greater than the third diameter.

As further illustrated in FIG. 2D, the first and second portions 212, 214 of the conductive material 210 are generally continuous (e.g., resulting from a single deposition and/or filling process). Furthermore, because the conductive material 210 fills the void between the first and second surfaces 112, 114 created by the processes of FIGS. 2A-2C, the conductive material 210 is automatically aligned with the first routing structure 152 of the metallization layer 150. As a result, the conductive material 210 forms a conductive TSV between the first routing structure 152 at the first surface 112 and the second surface 114, thereby enabling signal routing lines to pass directly through the semiconductor substrate 110.

It will be understood that the etching and filling process that is illustrated in FIGS. 2C and 2D can be repeated to form additional TSVs corresponding to any of the other pillars 120 resulting from the process illustrated in FIGS. 1A-1M. In such embodiments, the first and second portions of each TSV are electrically insulated from each other by the first and second dielectric materials 140, 240. Additionally, or alternatively, the etching and filling process illustrated in FIGS. 2C and 2D (and/or any repetition thereof) can form multiple openings 220 (FIG. 2C) corresponding to multiple pillars 120 at one time. Accordingly, multiple TSVs can be formed in one pass through the process illustrated in FIGS. 2A-2D. Similar to the repeated process, the first and second portions of each of the TSVs formed at once are electrically insulated from each other by the first and second dielectric materials 140, 240.

FIGS. 3A-3D are partially schematic cross-sectional views of a semiconductor device 100 of the type resulting from the process in FIGS. 1A-1M during various stages of producing TSVs in accordance with further embodiments of the present technology. For example, similar to the start of the process illustrated in FIGS. 2A-2D, FIG. 3A illustrates the semiconductor device 100 after a second photoresist material 230 is deposited onto the second surface 114 of the semiconductor substrate 110.

Figure 3A:
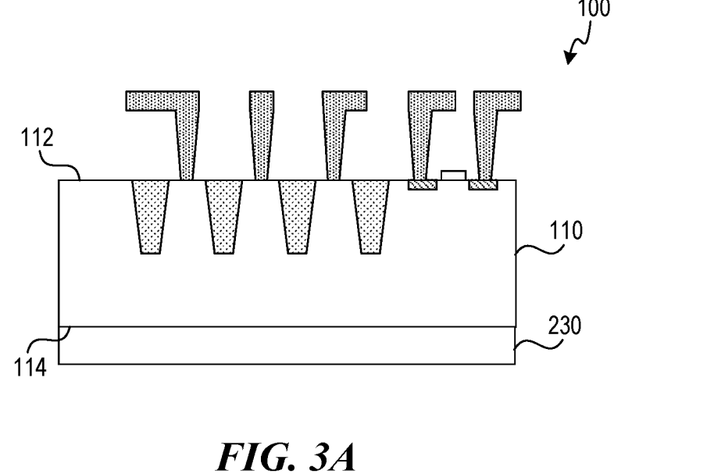
FIGS. 3A-3D are partially schematic cross-sectional views of a semiconductor device after various stages associated with producing nano through substrate vias in accordance with further embodiments of the present technology.
Figure 3B:
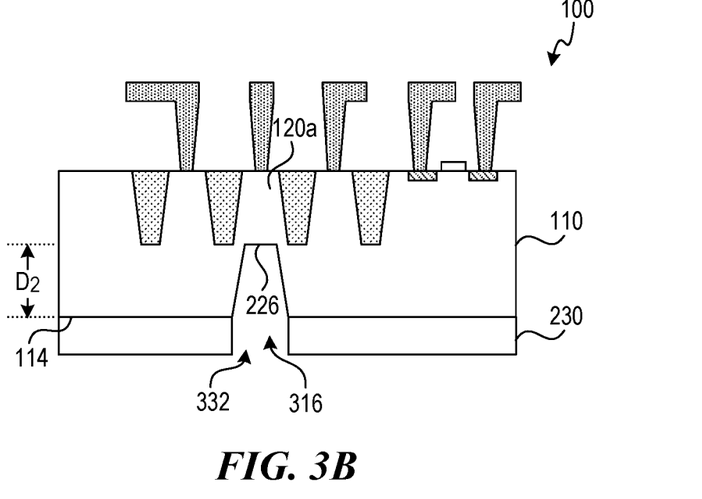

FIG. 3B illustrates the semiconductor device 100 after patterning the second photoresist material 230 to form a pattern 332 that is vertically aligned with at least a portion of a single one of the pillars 120. In the illustrated embodiment, for example, the pattern 332 is vertically aligned with the central pillar 120a. As further illustrated in FIG. 3B, the second surface 114 of the semiconductor substrate 110 can then be etched to form a second trench 320 in the second surface 114. The second trench 320 can be formed to the second depth $D_2$ such that the second trench 320 exposes a base surface 226 of the central pillar 120a.

Figure 3C:
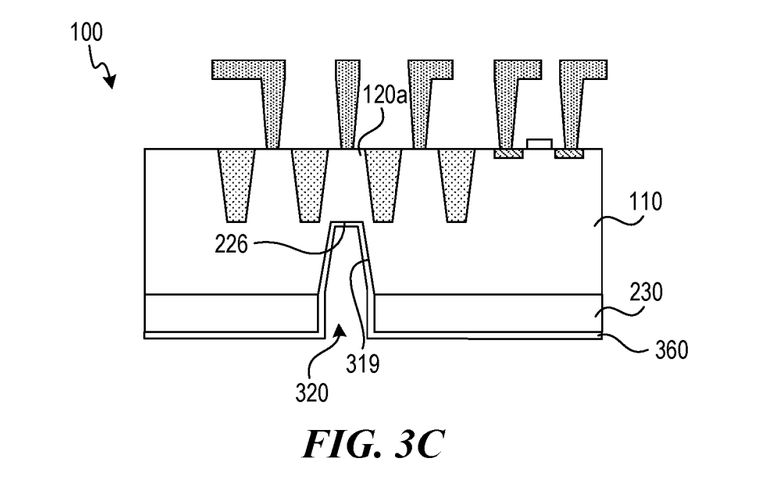

FIG. 3C illustrates the semiconductor device 100 after an insulation layer 360 is deposited over the second photoresist material 230 and into the second trench 320. The insulation layer 360 can prevent any covered surface from any subsequent etching process. For example, the insulation layer 360 covering the sidewalls 319 of the second trench 320 can prevent any subsequent etching process from further etching the semiconductor substrate 110 longitudinally and widening the second trench 320.

The portion of the insulation layer 360 covering the base surface 226 of the central pillar 120a can then be stripped to expose the base surface 126 and allow the central pillar 120a to be etched through the second trench 320. Further, because the central pillar 120a is surrounded by the dielectric material 140, the second etching process can be run until the central pillar 120a is fully exhumed, thereby leaving a void between the first and second surfaces 112, 114 of the semiconductor substrate 110.

Similar to the embodiments illustrated above with respect to FIG. 2D, FIG. 3D illustrates the semiconductor device 100 after the void is filled with a conductive material 310, thereby forming a TSV between first and second surfaces 112, 114 of the semiconductor substrate 110. The conductive material 210 can include a first portion 312 and a second portion 314 generally continuous with the first portion. The first portion 312 includes a first end at the first surface 112 and a second end opposite the first end. Similarly, the second portion 314 includes a first end coupled to the second end of the first portion 312 and a second end opposite the first end and at the second surface 114. Further, each of the first portion and second portions 312, 314 have a frustoconical shape. The first ends have a first diameter $Di_3$ (and therefore a first cross-sectional area) while the second ends have a second diameter $Di_4$ (and therefore a second cross-sectional area) that is greater than the first diameter $Di_3$. However, as discussed above, the first and second portions 312, 314 can each have a generally frustoconical shape with varying dimensions. Purely by way of example, the first end of the second portion 314 can have a third diameter that is different from either of the first and second diameters $Di_3$, $Di_4$, while the second end has a fourth diameter that is greater than the third diameter.

Figure 3D:
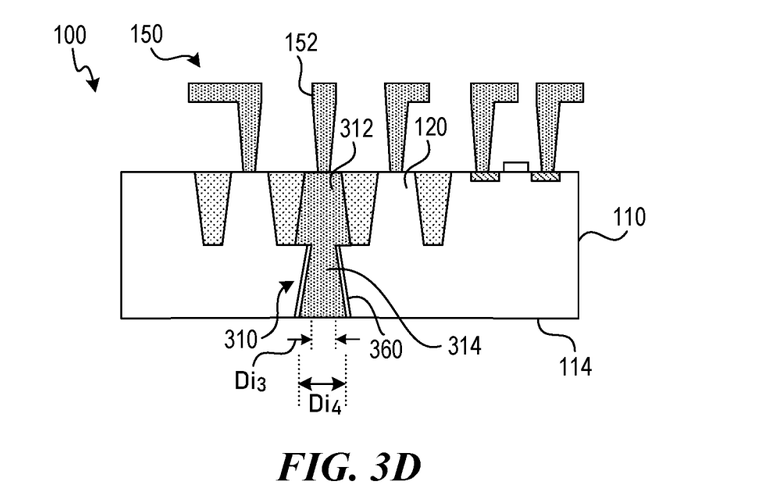

As further illustrated in FIG. 3D, the second photoresist material 230 and most of the insulation layer 260 have been stripped from the second surface 114 of the semiconductor substrate 110. However, a portion of the insulation layer 360 remains surrounding the second portion 314 of the conductive material 310.

It will be understood that the etching and filling process that is illustrated in FIGS. 3B-3D can be repeated to form additional TSVs corresponding to any of the other pillars 120 resulting from the process illustrated in FIGS. 1A-1M. In such embodiments, the first portions of each of the TSVs are electrically insulated by the dielectric material 140 (FIG. 1K) while the second portions of each of the TSVs are electrically insulated from each other by the semiconductor substrate 110. Additionally, or alternatively, the etching and filling process illustrated in FIGS. 3B-3D (and/or any repetition thereof) can form multiple second trenches 320 (FIG. 3B) corresponding to multiple pillars 120. Accordingly, multiple TSVs can be formed in one pass through the process illustrated in FIGS. 3B-3D.

Figure 4A:
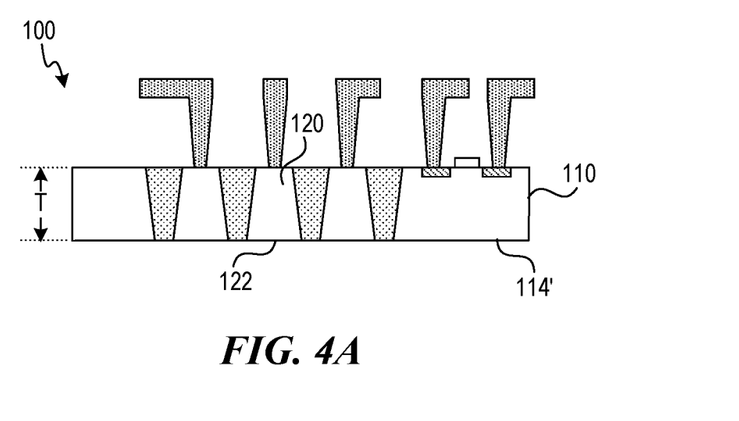
FIGS. 4A-4C are partially schematic cross-sectional views of a semiconductor device after various stages associated with producing nano through substrate vias in a thinned substrate in accordance with some embodiments of the present technology.
Figure 4B:
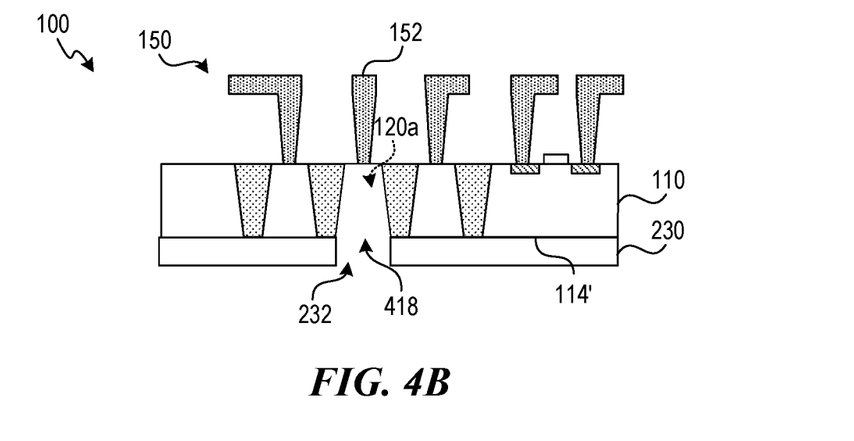
Figure 4C:
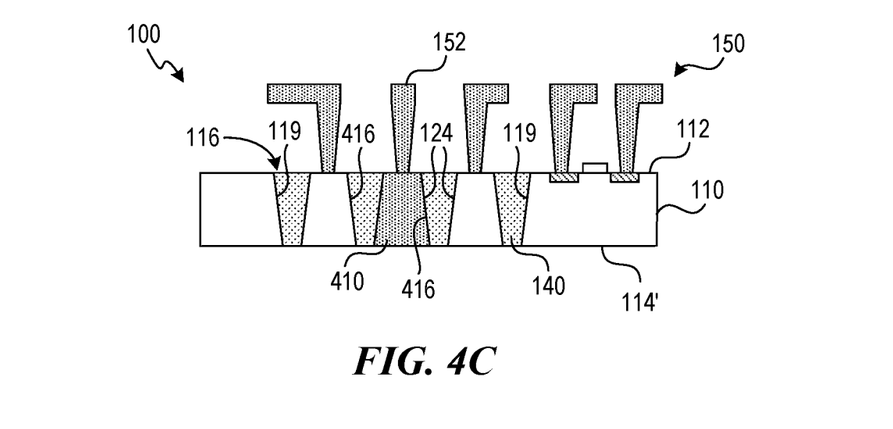

FIGS. 4A-4C are partially schematic cross-sectional views of a semiconductor device 100 of the type illustrated in FIGS. 1A-1M during various stages of producing TSVs in accordance with further embodiments of the present technology. For example, FIG. 4A illustrates the semiconductor device 100 after the semiconductor substrate 110 has been thinned to a thickness T. The thinning process removes material from the second surface 114 (FIG. 1B) of the semiconductor substrate 110 and can include various suitable thinning techniques (e.g., back-grinding, chemical mechanical polishing, wet etching, dry chemical etching, and the like).

As further illustrated in FIG. 4A, the thickness T is approximately equal to (or equal to) the depth $D_1$ (FIG. 1E) of base surface 122 of each of the pillars 120. As a result, the thinning process exposes the base surface 122 through the second surface 114' of the semiconductor substrate 110. In various embodiments, the thickness T can be between about 0.5 micrometers (μm) and about 5 μm, between about 1 μm and about 3 μm, or can be about 2 μm.

FIG. 4B illustrates the semiconductor device 100 after a second photoresist material 230 is deposited on the second surface 114' (and therefore an exposed base surface 122 of each of the pillars 120) and patterned to form a pattern 432. The pattern 432 is vertically aligned with the central pillar 120a to expose the base surface 122 while covering the remainder of the second surface 114'. The central pillar 120a can then be removed (e.g., through a wet etch process) to form a second trench 418 extending between the first and second surfaces 112, 114'. Further, because the trench 418 is formed by exhuming the central pillar 120a, the trench 418 is vertically aligned with the first routing structure 152 of the metallization layer 150.

FIG. 4C illustrates the semiconductor device 100 after filling the second trench 418 with a conductive material 410 to form a TSV between the first and second surfaces 112, 114'. Similar to the first and/or second portions of the conductive materials 210, 310 discussed above, the conductive material has a generally frustoconical shape, with a first end at the first surface 112 that has a smaller diameter (and therefore a smaller footprint) than a second end at the second surface 114'. As a result, the conductive material 410 in the TSV includes sidewalls 416 that slope inwardly from the second surface 114' to the first surface 112. In contrast, as discussed above, the first trench 116 includes peripheral sidewalls 119 that slope outwardly from the second surface 114' to the first surface 112. That is, the sidewalls 416 of the conductive material 410 are sloped generally opposite to the peripheral sidewalls 119 of the first trench 116. In some embodiments, the magnitude of the sidewalls 416 of the conductive material 410 is generally equal to (or equal to) the magnitude of the slope of the peripheral sidewalls 119 of the first trench 116.

As further illustrated in FIG. 4C, because the conductive material 410 in the TSV replaced the central pillar 120a (FIG. 4B) on which the first routing structure 152 of the metallization layer 150 was formed, the conductive material 410 is auto-aligned with the first routing structure 152. Accordingly, the conductive material establishes a conductive path between the second surface 114' of the semiconductor substrate 110 and the metallization layer 150.

Similar to the discussion above with respect to FIGS. 2A-2D and 3A-3D, it will be understood that the etching and filling process illustrated in FIGS. 4B and 4C can be repeated to form additional TSVs corresponding to any of the other pillars 120. An example of a semiconductor device 100 with a plurality of TSVs 510 (two shown) is illustrated in FIG. 5.

Figure 5:
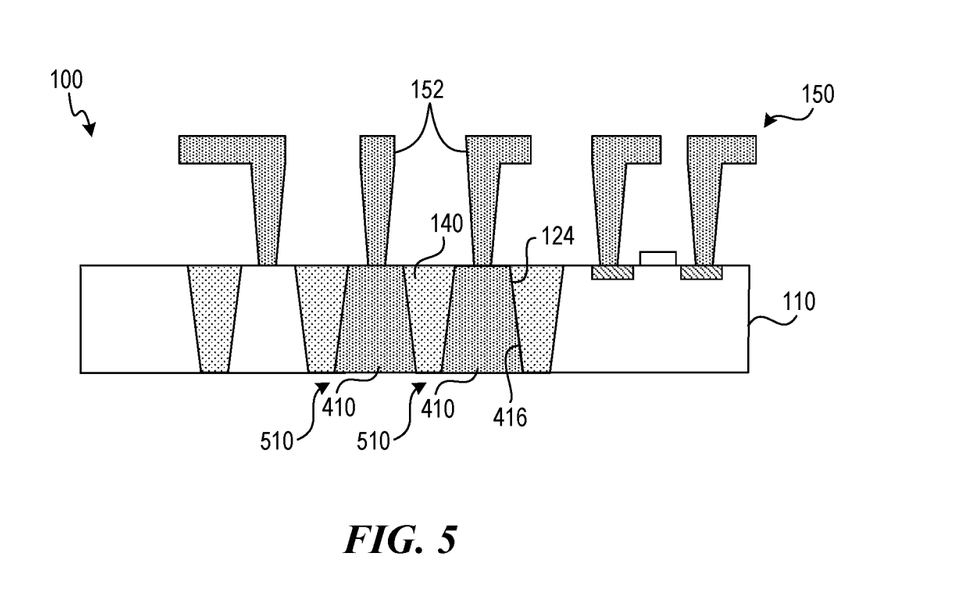
FIG. 5 is a partially schematic cross-sectional view of a semiconductor device with a plurality of nano through substrate vias in accordance with some embodiments of the present technology.

As illustrated in FIG. 5, each of the TSVs 510 has a frustoconical shape filled with the conductive material 410. Further, the conductive material 410 in each of the TSVs 510 includes sidewalls 416 that slope inwardly from the second surface 114' to the first surface 112 while the peripheral sidewalls 119 of the first trench 116 slope outwardly. As further illustrated in FIG. 5, each of the TSVs 510 is electrically insulated from the other by the dielectric material 140 in the first trench 116.

It will be understood, as discussed above, that the etching and filling process that is illustrated in FIGS. 4B and 4C (and/or any repetition thereof) can form multiple TSVs 510 at once (e.g., rather than one at a time). Accordingly, for example, each of the plurality of TSVs 510 can be formed in one pass through the process illustrated in FIGS. 4B and 4C.

Figure 6:
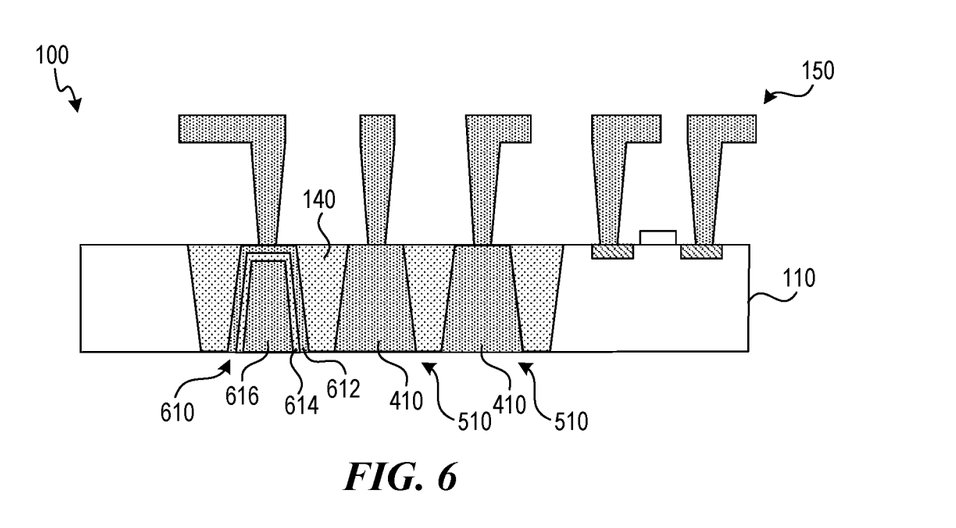
FIG. 6 is a partially schematic cross-sectional view of a semiconductor device with a plurality of nano through substrate vias in accordance with further embodiments of the present technology.

FIG. 6 is a partially schematic cross-sectional view of a semiconductor device 600 with a plurality of the TSVs 510 (two shown) in accordance with further embodiments of the present technology. In the illustrated embodiment, the etching and filling process that is illustrated in FIGS. 4B and 4C has been modified to form a capacitor 610 in place of one of the pillars 120 (FIG. 1M). In particular, for example, the pillar 120 can be exposed through a pattern in a third photoresist material, exhumed, then filled in a layered process. A first layer 612 can include a conductive material coupled to the metallization layer 150 at the first surface 112 of the semiconductor substrate 110; a second layer 614 can include a dielectric material that at least partially insulates the first layer 612 from a third layer 616. Similar to the first layer 612, the third layer 616 can include a conductive material that is exposed at the second surface 114' of the semiconductor substrate 110.

In some embodiments, the layered process is alternatively employed to fill the first and/or second portions of the conductive material 210, 310 in the TSVs discussed above with respect to FIGS. 2D and 3D. Purely by way of example, a conductive material in the first portion 212 (FIG. 2D) of the conductive material 210 can be insulated from a conductive material in the second portion 214 by a dielectric layer therebetween, thereby forming a capacitor in place of the conductive material 210. In another example, a first layer containing a conductive material can be deposited in the first and second portions; a second layer containing a dielectric material can be deposited over the first layer in the first and second portions; and a third layer containing a conductive material can be deposited over the second layer in the first and second portions. As a result, a capacitor with multiple layers of the stacked frustoconical shape can be formed in place of the first and/or second portions of the conductive material 210, 310 in the TSVs discussed above with respect to FIGS. 2D and 3D.

Figure 7:
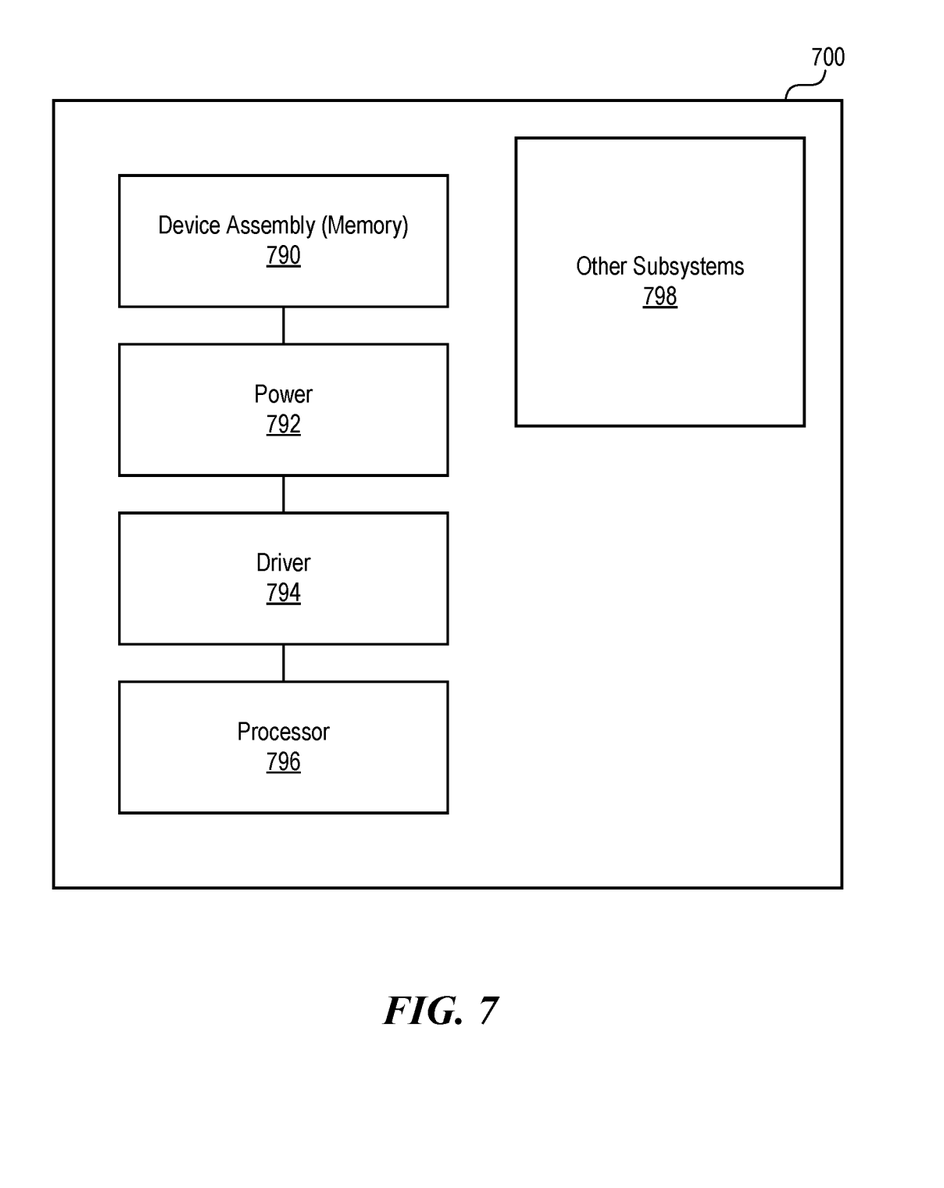
FIG. 7 is a schematic view of a system that includes a semiconductor die assembly configured in accordance with embodiments of the present technology.

FIG. 7 is a schematic view of a system that includes a semiconductor die assembly configured in accordance with embodiments of the present technology. Any one of the semiconductor devices having the nano TSVs and/or resulting from the processes described above with reference to FIGS. 1A-6 can be incorporated into any of a myriad of larger and/or more complex systems, a representative example of which is system 700 shown schematically in FIG. 7. The system 700 can include a memory 790 (e.g., SRAM, DRAM, flash, and/or other memory devices), a power supply 792, a drive 794, a processor 796, and/or other subsystems or components 798. Semiconductor devices having nano TSVs like those described above with reference to FIGS. 2D, 3D, and 4C-6, can be included in any of the elements shown in FIG. 7. For example, the processor 796 can include a semiconductor device with nano TSVs to establish signal routes between stacked semiconductor components. The resulting system 700 can be configured to perform any of a wide variety of suitable computing, processing, storage, sensing, imaging, and/or other functions. Accordingly, representative examples of the system 700 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 700 include lights, cameras, vehicles, etc. With regard to these and other examples, the system 700 can be housed in a single unit or distributed over multiple interconnected units, e.g., through a communication network. The components of the system 700 can accordingly include local and/or remote memory storage devices and any of a wide variety of suitable computer-readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "approximately" and "about" are used herein to mean within at least within 10 percent of a given value or limit. Purely by way of example, an approximate ratio means within a ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a semiconductor substrate having a first surface and a second surface opposite the first surface, wherein the semiconductor substrate includes a trench formed in the first surface;
   a dielectric material filling the trench in the first surface of the semiconductor substrate; and
   a through substrate via that includes a conductive material having:
      a first portion having a first end at the first surface of the semiconductor substrate and a second end opposite the first end, wherein the first end has a first cross-sectional area and the second end has a second cross-sectional area larger than the first cross-sectional area, and wherein the first portion of the through substrate via is formed into the dielectric material; and
      a second portion having a third end coupled to the second end of the first portion and a fourth end at the second surface of the semiconductor substrate, wherein the third end has a third cross-sectional area different from the second cross-sectional area and the fourth end has a fourth cross-sectional area larger than the third cross-sectional area.

2. The semiconductor device of claim 1, wherein the conductive material in the through substrate via is continuous between the first portion and the second portion.

3. The semiconductor device of claim 1, wherein the third cross-sectional area of the third end is smaller than the second cross-sectional area of the second end.

4. The semiconductor device of claim 1, further comprising a metallization layer carried by the second surface of the semiconductor substrate and electrically coupled to the through substrate via.

5. The semiconductor device of claim 1, wherein each of the first portion and the second portion of the through substrate via has a frustoconical shape.

6. The semiconductor device of claim 1, wherein the trench is a first trench and the dielectric material is a first dielectric material, wherein the semiconductor substrate includes a second trench formed in the second surface surrounding the second portion of the through substrate via, and wherein the semiconductor device further comprises a second dielectric material filling the second trench.

7. The semiconductor device of claim 6, wherein the first trench has a fifth cross-sectional area at the first surface of the semiconductor substrate, and wherein the second trench has a sixth cross-sectional area at the second surface of the semiconductor substrate different from the fifth cross-sectional area.

8. The semiconductor device of claim 1, wherein the through substrate via further includes an insulation layer between the conductive material in the first portion and the semiconductor substrate.

9. The semiconductor device of claim 1, wherein the through substrate via is one of a plurality of through substrate vias each having the first portion and the second portion, and wherein the second portion of each of the through substrate vias is surrounded by a dielectric material in a trench formed in the second surface.

10. A semiconductor device, comprising:

a semiconductor substrate having an upper surface and a lower surface opposite the upper surface, wherein the semiconductor substrate includes a first trench formed in the upper surface of the semiconductor substrate and a second trench formed in the lower surface;

two or more through substrate vias at least partially filled with a conductive material extending from the upper surface to the lower surface, each of the two or more through substrate vias having sidewalls sloping inwardly from a depth beneath the upper surface of the semiconductor substrate to the upper surface of the semiconductor substrate, wherein the two or more through substrate vias include a first through substrate via and a second through substrate via;

a first dielectric material filling the first trench and surrounding an upper portion of each of the first and second through substrate vias at the upper surface of the semiconductor substrate, the first dielectric material including peripheral sidewalls sloping outwardly from the depth to the upper surface of the semiconductor substrate; and a second dielectric material filling the second trench and surrounding a lower portion of each of the first and second through substrate vias at the lower surface of the semiconductor substrate such that the second dielectric material electrically insulates a conductive material in the lower portion of the first through substrate via from the conductive material in the lower portion of the second through substrate via.

11. The semiconductor device of claim 10, wherein the sidewalls of each of the two or more through substrate vias has an inward slope with a first magnitude, and wherein the peripheral sidewalls have an outward slope with a second magnitude equal to the first magnitude.

12. The semiconductor device of claim 10, wherein the sidewalls are first sidewalls at the upper portion of each of the two or more through substrate vias, wherein the two or more through substrate vias include second sidewalls at the lower portion, and wherein the second sidewalls slope inwardly from the lower surface of the semiconductor substrate to the depth within the semiconductor substrate.

13. The semiconductor device of claim 10, wherein each of the two or more through substrate vias has a stacked frustoconical shape.

\* \* \* \* \*